United States Patent [19]

Cini et al.

[11] Patent Number: 4,698,519

[45] Date of Patent: Oct. 6, 1987

[54] MONOLITHICALLY INTEGRATABLE HIGH-EFFICIENCY CONTROL CIRCUIT FOR SWITCHING TRANSISTORS

[75] Inventors: Carlo Cini, Cornaredo; Claudio Diazzi; Pietro Erratico, both of Milan, all of Italy

[73] Assignee: SGS Microelettronica SpA, Agrate Brianza, Italy

[21] Appl. No.: 812,935

[22] Filed: Dec. 23, 1985

[30] Foreign Application Priority Data

Dec. 28, 1984 [IT] Italy ............................. 24275 A/84

[51] Int. Cl.⁴ ...................... H03K 17/60; H03K 3/33
[52] U.S. Cl. ................................. 307/254; 307/300; 307/570
[58] Field of Search ............... 307/254, 300, 280, 314, 307/570, 255; 323/289

[56] References Cited

U.S. PATENT DOCUMENTS 4,467,226  8/1984  Nagasawa ........................... 307/315
4,603,268  7/1986  Davis ................................. 307/315

Primary Examiner—Stanley D. Miller
Assistant Examiner—B. P. Davis
Attorney, Agent, or Firm—Wenderoth, Lind & Ponack

[57] ABSTRACT

A monolithically integrable high-efficiency control circuit for the switching of transistors includes a first transistor whose base terminal is connected to a source of switching signals. A second transistor whose base is connected to a current generator, drives a third transistor which connected in series with the first transistor such that the first and third transistors are connected between two terminals of a supply voltage generator. The emitter terminal of the third transistor forms an output terminal of the control circuit and is connected to the collector terminal of the first transistor by means of a parallel connected diode and a resistor combination. The circuit also includes a fourth transistor, whose base terminal is connected through a resistor to the base terminal of the third transistor and whose collector and emitter terminals are respectively connected to the base terminal of the second transistor and to the collector terminal of the first transistor.

7 Claims, 3 Drawing Figures

MONOLITHICALLY INTEGRATABLE HIGH-EFFICIENCY CONTROL CIRCUIT FOR SWITCHING TRANSISTORS

BACKGROUND OF THE INVENTION

The present invention relates to control circuits for the switching of transistors, more particularly to a monolithically integratable control circuit for the controlled switching of power transistors, both of the bipolar and the field-effect type, for use in audio devices, for example.

Control circuits for the controlled switching of power transistors generally comprise a final stage of the push-pull type for the purpose of supplying to the load, with a high degree of efficiency, a flow of current that, at various times, can have opposite directions. In this way, high switching speeds can be achieved, accelerating, for example, the turn-off of transistors by extracting the charge stored therein.

FIG. 1 of the drawings shows a known circuit diagram of this type commonly used to control both bipolar and field-effect transistors.

The circuit comprises a first bipolar NPN transistor $Q_1$, having a base terminal coupled by means of a first resistor $R_1$ to a switching-signal source denoted in the figure by a block SW.

The emitter and collector terminals of this transistor are respectively connected to the negative terminal $-V_{cc}$ of a supply voltage generator and, by means of a constant-current generator $A_l$, to the positive terminal $+V_{cc}$ of the supply voltage generator.

The circuit also comprises a second NPN bipolar transistor $Q_2$ and a third NPN bipolar transistor $Q_3$.

The base and emitter terminals of transistor $Q_2$ are respectively connected to the collector terminal of transistor $Q_1$ and to the base terminal of transistor $Q_3$.

The collector terminals of transistors $Q_2$ and $Q_3$ are both connected to the positive terminal $+V_{cc}$.

The anode and the cathode of a first diode $D_l$ are respectively connected to the emitter and base terminals of transistor $Q_2$.

The anode and the cathode of a second diode $D_2$ are respectively connected to the emitter and the base terminals of transistor $Q_3$.

A second resistor $R_2$ is interposed between the emitter and base terminals of transistor $Q_3$. The emitter terminal of transistor $Q_3$ forms an output terminal OUT of the circuit.

Let us now examine the operation of the prior art circuit depicted in FIG. 1.

The switching signals supplied by the source SW give rise to transients of the voltage $V_{IN}$ applied to the base terminal of transistor $Q_1$ through resistor $R_1$ and with respect to the potential of the negative terminal $-V_{cc}$ may change from a "high" to a "low" level, and vice versa.

When the level of voltage $V_{IN}$ is high, transistor $Q_1$ operates at saturation and absorbs all of the current supplied by generator $A_1$, thereby keeping transistor $Q_2$ turned off and consequently, transistor $Q_3$ is kept off so as to not supply current to the load.

Since transistor $Q_3$ is turned off, the level of the voltage $V_{OUT}$ at the output terminal with respect to the potential of the negative terminal $-V_{cc}$ is low.

Diodes $D_l$ and $D_2$ permit the extraction of stored charge from the load connected to the output terminal during the turn-off phase. The load, which is not shown in FIG. 1, may be a power transistor.

When the level of the voltage $V_{IN}$ drops as a result of a switching signal originating in the source SW, transistor $Q_1$ is turned off, so that all of the current supplied by the generator $A_1$ is supplied to transistor $Q_2$, which becomes conductive. Transistor $Q_3$ as well, driven by transistor $Q_2$, starts to conduct, supplying current to the load connected to the output terminal OUT. The level of the output voltage $V_{OUT}$ rises as soon as transistor $Q_3$ leaves the OFF-state.

The constant-current generator $A_1$ is so designed that it has an adequate flow of current not only to cause the swift conduction of transistors $Q_2$ and $Q_3$, which were previously turned off, but also to enable transistor $Q_1$ to be switched rapidly from the saturation state to the OFF-state thanks to a rapid charge of the equivalent capacitance between collector and emitter of said transistor.

SUMMARY OF THE INVENTION

The present invention has as its objective the provision of a monolithically integratable control circuit for the switching of power transistors, whose overall efficiency is higher than that of prior art control circuits.

This object is achieved by means of the control circuit for the switching of transistors defined and characterized in the claims appended to the present description.

This object may be achieved by providing a monolithically integratable control circuit for the switching of transistors, comprising a first, a second and a third transistor, each having a first terminal, a second terminal, and a control terminal, said control terminal of said first transistor being coupled to a source of switching signals, said control terminal of said second transistor being coupled to a first terminal of a supply voltage generator by means of a current generator, and said control terminal of said third transistor being connected to said first terminal of the second transistor, said second terminal of said second transistor and said second terminal of said third transistor both being connected to said first terminal of said supply voltage generator, said second terminal of said first transistor being coupled to said first terminal of said third transistor and forming an output terminal of the circuit, said first terminal of said first transistor being connected to a second terminal of said supply voltage generator; said circuit further comprising a fourth transistor, having a first terminal, a second terminal and a control terminal which are respectively connected to said second terminal of said first transistor and to said control terminal of said second transistor and, through a first resistor, to said control terminal of said third transistor, said second terminal of said first transistor being connected to said control terminal of said third transistor through a second resistor, and being connected to said first terminal of said third transistor through a resistive element.

BRIEF DESCRIPTION OF THE DRAWINGS

The invention will be better understood from a consideration of the ensuing detailed description given solely by way of non-limitative example with reference to the accompanying drawings, in which.

In the drawing figures, like reference letters and numerals denote like parts.

DESCRIPTION OF THE PREFERRED EMBODIMENT

Figure 1:
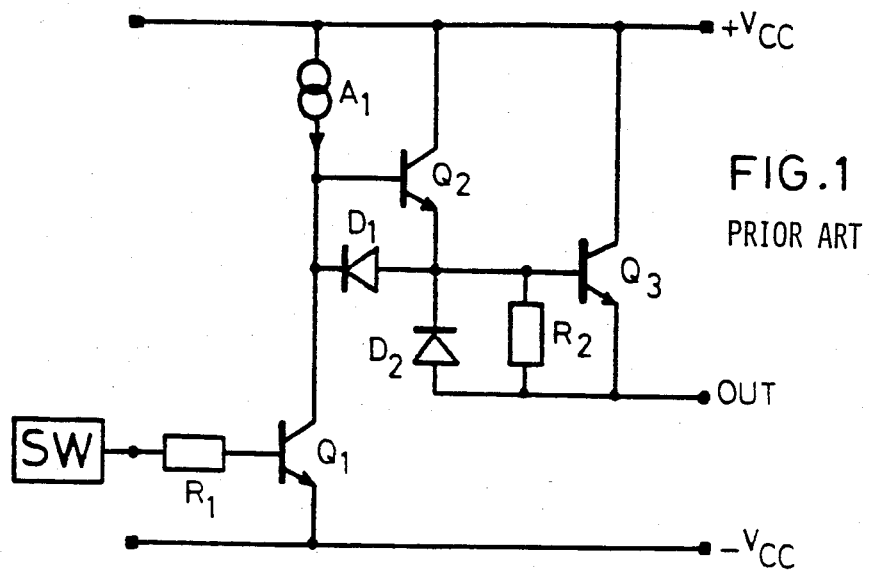
FIG. 1 is a diagram of a known control circuit as described above for the switching of power transistors.
Figure 2:
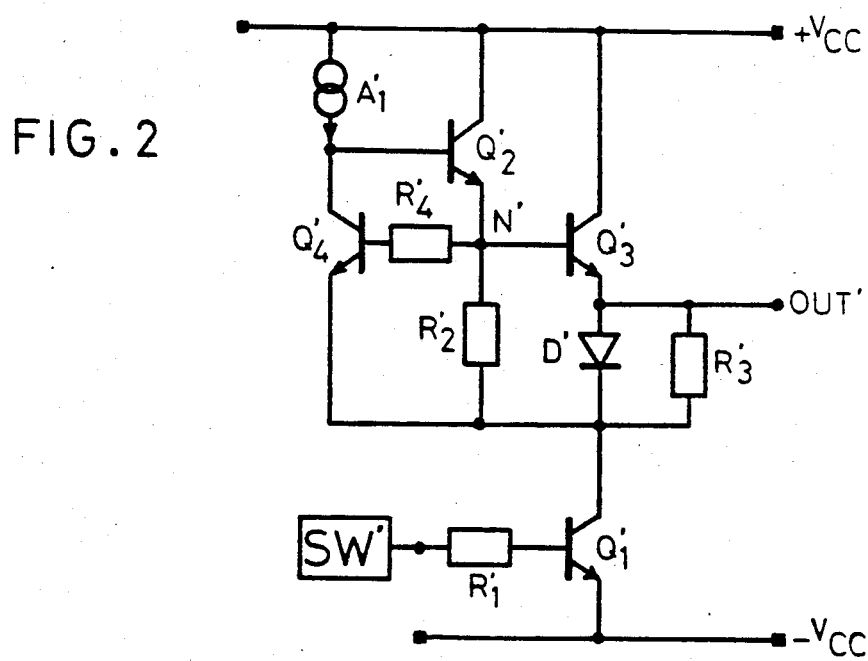
FIG. 2 is a diagram of a control circuit in accordance with the present invention for the switching of power transistors.

The diagram of a control circuit for switching according to the present invention as shown in FIG. 2 comprises a first bipolar NPN transistor $Q'_1$, having a base terminal coupled by a first resistor $R'_1$ to a switching-signal source represented in the figure by a block denoted with the symbol SW'.

The switching-signal source SW' can also be a simple circuit used for coupling to a switching-signal generator which is external to the integrated circuit containing the control circuit.

This circuit diagram includes a second ($Q'_2$), a third ($Q'_3$), and a fourth NPN bipolar transistor ($Q'_4$)

The collector terminals of transistors $Q'_2$ and $Q'_3$ are connected to the positive terminal $+V_{cc}$ of a supply voltage generator whose negative terminal $-V_{cc}$ is connected to the emitter terminal of the first transistor $Q'_1$.

Figure 3:
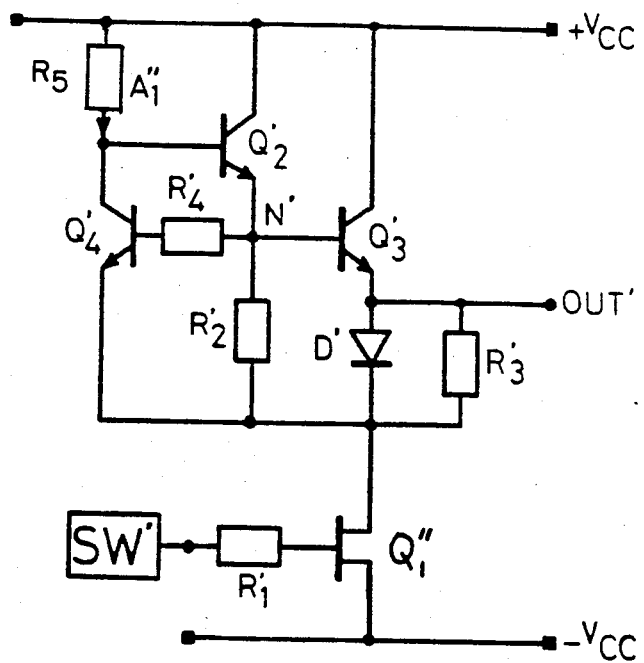
FIG. 3 is a diagram of a modified version of the circuit illustrated in FIG. 2.

The base terminal of transistor $Q'_2$ is connected to the positive terminal $+V_{cc}$ by means of a current generator $A'_1$ and is also connected to the collector terminal of transistor $Q'_4$. This current generator $A'_1$ may also alternatively be a simple resistor interposed between the positive terminal $+V_{cc}$ and the base terminal of transistor $Q'_2$. This is shown in FIG. 3 in which current generator $A''_1$ is a resistor $R_5$. Ideally, the current generator should be a constant-current generator.

The emitter terminal of transistor $Q'_2$ is connected to the base terminal of transistor $Q'_3$ at a circuit node N'. The collector terminal of transistor $Q'_1$ and the emitter terminal of transistor $Q'_1$ and the emitter terminal of transistor $Q'_4$ are also connected to the node N' via a second resistor $R'_2$.

The collector terminal of transistor $Q'_1$ is connected to the emitter terminal of transistor $Q'_3$ by means of a diode D' and a third resistor $R'_3$ which are connected in parallel.

The anode and the cathode of diode D' are respectively connected to the emitter terminal of transistor $Q'_3$ and to the collector terminal of transistor $Q'_1$.

The base terminal of transistor $Q'_4$ is connected to the base terminal of transistor $Q'_3$ at the circuit node N' by means of a fourth resistor $R'_4$.

The emitter terminal of transistor $Q'_3$ forms an output terminal OUT' of the circuit, to which is connected to load (typically a power transistor) not shown in FIG. 2.

The operation of a control circuit in accordance with the present invention is described below with reference to the circuit diagram of FIG. 2.

The switching signals supplied by the source SW' give rise to transients of the voltage $V_{IN}$ applied through resistor $R'_1$ to the base terminal of transistor $Q'_1$ and with respect to the potential of the negative terminal $-V_{cc}$, may change from a "high" to a "low" level, and vice versa.

When the level of the voltage $V_{IN}$ is high, transistor $Q'_1$ operates at saturation and absorbs all of the current flowing through transistors $Q'_2$, $Q'_3$, and $Q_4$.

The current supplied by generator $A'_1$ keeps transistor $Q'_2$ turned on which in turn keeps transistors $Q'_3$ and $Q'_4$ turned on.

Although transistor $Q'_4$ receives its base current through resistor $R'_4$ which, in the illustrated embodiment of the circuit, must have a rather high value, it is mainly this transistor that must conduct the current. Although transistor $Q'_3$, which is coupled to transistor $Q'_4$ in a current-mirror configuration, receives its base current directly from transistor $Q'_2$, can virtually not conduct the current because of the biasing conditions imposed by the emitter resistor $R'_3$ and the diode D' connected in parallel thereto.

Transistor $Q'_4$ limits the conduction of transistor $Q'_2$, absorbing a considerable portion of the current supplied by generator $A'_1$ and therefore practically reduces the conduction of transistor $Q'_3$ to zero.

In this way, one avoids by means of transistor $Q'_3$ the useless waste of energy otherwise caused by the current absorbed by saturated transistor $Q'_1$.

Saturated transistor $Q'_1$ not only prevents the load from being powered, but also, if it is a bipolar transistor, it will extract the charge stored therein, causing it to be turned off very rapidly. Moreover, and this is very important when a power transistor is control-switched, the level of the voltage $V_{OUT}$ at the output terminal with respect to the potential of the negative terminal $-V_{cc}$ will drop as soon as transistor $Q'_1$ becomes saturated.

Even though in such conditions the absorption of supply current through transistor $Q'_3$ is practically zero, this transistor is never turned off, so that it can immediately subsequently conduct high currents. In fact, when the level of the voltage $V_{IN}$ drops as a result of a switching signal originating in the source SW', transistor $Q'_1$ will be turned off, enabling the voltage level at the output terminals OUT' to rise.

Since transistor $Q'_1$ is now no longer conducting, all of the current that can flow through transistors $Q'_2$, $Q'_3$ and $Q'_4$ is supplied to the load connected to the output terminal OUT'.

Therefore, when the load is a power transistor connected by means of its base or gate terminal to the output terminal of the control circuit in accordance with the present invention, the latter can switch very rapidly from the OFF-state to the ON-state thanks to the immediately rising flow of current supplied thereto.

In fact, the OFF-state of transistor $Q'_1$ forces the discharge of the emitter current of transistor $Q'_4$ on the load through resistor $R'_3$. The emitter voltage of transistor $Q'_4$ thus becomes higher than the emitter voltage of transistor $Q'_3$ and hence transistor $Q'_3$ which, in contrast to transistor $Q'_4$, has no base resistor, is immediately raised to high levels of conduction, while the conduction level of transistor $Q'_4$ is reduced to practically zero.

Transistor $Q'_4$ does not absorb more current from current generator $A'_1$, so transistor $Q'_2$, whose base receives all of the current from generator $A'_1$, can drive transistor $Q'_3$ to its maximum conduction.

When the voltage level $V_{IN}$ is low again, the saturation of transistor $Q'_1$ will immediately stop the flow of current to the load.

The lowering of the collector-emitter voltage of transistor $Q'_1$ causes in the other transistors the operation described earlier.

With a control circuit according to the present invention, one can obtain a maximum switching frequency for a power transistor connected thereto, which is higher than that which can be achieved with the prior art circuit described earlier due to the fact that transistor $Q'_1$ is connected directly to the output terminal OUT' and transistor $Q'_3$ is never turned off.

As a matter of fact, when transistor $Q'_1$ switches from its saturation state to its OFF-state, the current necessary for charging the equivalent capacitance between collector and emitter of said transistor is not directly supplied by generator $A'_1$, but is supplied through transistors $Q'_2$ and $Q'_3$, which amplify the current thereof considerably.

Therefore, if the current of current generator $A'_1$ is equal to that of current generator $A_1$, the turn-off transient of transistor $Q'_1$ is faster than the turn-off transient of transistor $Q_1$ of the known circuit in which said transistor is directly connected to generator $A_1$. As a result, there is a further advantageous increase of the switching speed in favor of the circuit in accordance with the present invention.

At the same time, one avoids unnecessary power dissipation in a control circuit in accordance with the present invention, because of the fact that when transistor $Q'_1$ operates at saturation, transistor $Q'_4$ automatically operates in order to drastically limit the conduction of transistor $Q'_3$. In this way, by eliminating any unnecessary power dissipation in the form of heat, the operational reliability of the device containing the circuit is enhanced, and more economical systems may be used to dissipate the heat generated.

The overall efficiency of a circuit according to the present invention, intended as a combination of energy efficiency, operational reliability and maximum switching frequency is thus higher than that feasible with circuits of known construction.

However, it should be noted that in order to maintain the characteristics of switching speed when driving field-effect power transistors of the MOS (Metal-Oxide-Semi-conductor) type having a very high gate capacitance, it is necessary to compute the values of resistances $R'_2$, $R'_3$. and $R'_4$ with a high degree of precision so that, during the switching transient to the ON-state of the power transistor connected to the circuit, transistor $Q'_4$ will be turned off, thereby enabling the charge of said capacitance to be regulated solely by the overall gain of transistors $Q'_2$ and $Q'_3$.

While only a single embodiment of the invention has been described in detail, it will be understood, of course, that the invention is not limited thereto since many modifications may be made and it is, therefore, contemplated to cover by the appended claims any such modifications as fall within the true spirit and scope of the invention.

For example, as shown by the circuit diagram depicted in FIG. 3, the bipolar transistor $Q'_1$ shown in FIG. 2 can simply be replaced by a field-effect transistor $Q''_1$ without further modifications of the circuit diagram.

We claim;

1. A monolithically integratable control circuit for the switching of transistors, comprising a first, a second and a third transistor, each having a first terminal, a second terminal, and a control terminal, said control terminal of said first transistor being connected to a source of switching signals, said control terminal of said second transistor being connected to a first terminal of a supply voltage generator by means of a current generator, and said control terminal of said third transistor being connected to said first terminal of the second trnasistor, said second terminal of said second transistor and said second terminal of said third transistor both being connected to said first terminal of said supply voltage generator, said second terminal of said first transistor being connected to said first terminal of said third transistor by a resistive element, said first terminal of said third transistor forming an output terminal of the circuit, said first terminal of said first transistor being connected to a second terminal of said supply voltage generator; said circuit further comprising a fourth transistor, having a first terminal, a second terminal and a control terminal which are respectively connected to said second terminal of said first transistor and to said control terminal of said second transistor and, through a first resistor, to said control terminal of said third transistor, said second terminal of said first transistor being connected to said control terminal of said third transistor through a second resistor.

2. A control circuit as set forth in claim 1, wherein said resistive element comprises a diode.

3. A control circuit as set forth in claim 1, wherein said resistive element comprises a third resistor.

4. A control circuit as set forth in claim 1, wherein said resistive element comprises a diode and a third resistor connected in parallel.

5. A control circuit as set forth in claim 1, wherein said first, second, third, and fourth transistors comprise bipolar NPN transistors, and wherein said first terminal, said control terminal, and said second terminal of each of said transistors are respectively an emitter, a base, and a collector thereof.

6. A control circuit as set forth in claim 1, wherein said first transistor is a field-effect transistor, whose first terminal, control terminal, and second terminal are, respectively, a source, a gate, and a drain thereof.

7. A control circuit as set forth in claim 1, wherein said current generator comprises a resistor.

* * * * *